United States Patent [19]

Yamaoka et al.

[11] Patent Number: 5,527,659
[45] Date of Patent: Jun. 18, 1996

[54] CHEMICAL AMPLIFICATION RESIST COMPOSITION CONTAINING PHOTOCHEMICAL ACID GENERATOR, BINDER AND SQUARYLIUM COMPOUND

[75] Inventors: Tsuguo Yamaoka, Funabashi; Kenichi Koseki, Chiba; Mitsuharu Obara, Yokahama; Ikuo Shimizu, Yokkaichi; Yukiyoshi Ito, Tokyo, all of Japan

[73] Assignee: Kyowa Hakko Kogyo Co., Ltd., Tokyo, Japan

[21] Appl. No.: 331,147

[22] Filed: Oct. 28, 1994

Related U.S. Application Data

[63] Continuation of Ser. No. 52,999, Apr. 27, 1993, abandoned.

[30] Foreign Application Priority Data

May 6, 1992 [JP] Japan ................................. 4-113604

[51] Int. Cl.$^6$ ................................................. G03F 7/021
[52] U.S. Cl. ........................... 430/179; 430/176; 430/191; 430/270.1; 430/914; 430/920
[58] Field of Search ........................ 430/175, 176, 430/179, 191, 270, 914, 920

[56] References Cited

U.S. PATENT DOCUMENTS

| | | | |
|---|---|---|---|
| 4,554,238 | 11/1985 | Bushman | 430/258 |
| 4,743,528 | 5/1988 | Farid et al. | 430/281 |
| 4,743,530 | 5/1988 | Farid et al. | 430/281 |
| 4,743,531 | 5/1988 | Farid et al. | 430/281 |
| 4,997,745 | 5/1991 | Kawamura et al. | 430/281 |

FOREIGN PATENT DOCUMENTS

| | | | |
|---|---|---|---|
| 0379200 | 7/1990 | European Pat. Off. | 430/281 |
| 0452263 | 10/1991 | European Pat. Off. | |
| 106548 | 4/1992 | Japan | |

OTHER PUBLICATIONS

Solid State Technology, vol. 400, No. 34 (1991) 53–60.
IBM Technical Disclosure Bulletin, vol. 33, No. 2 (1990) 272–273.
Polymer Eng. & Sci., vol. 29 (1989) 856–858.
Polymer Preprints, Japan, vol. 41, No. 3, Jap. Soc. Polymer Science.
Extended Abstracts, 53rd Autumn Meeting (1992) Jap. Soc. Applied Physics.
Abstracts of Lecture, Autumn Meeting (1992), Jap. Soc. Photography.

*Primary Examiner*—Charles L. Bowers, Jr.
*Assistant Examiner*—Christopher G. Young
*Attorney, Agent, or Firm*—Fitzpatrick Cella Harper & Scinto

[57] ABSTRACT

There is described a chemical amplification resist composition which comprises squarylium compounds represented by the formula (I):

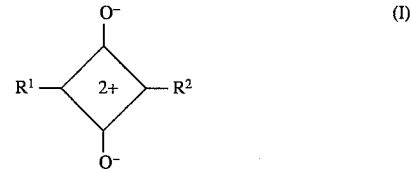

wherein $R^1$ and $R^2$ are the same or different and represent substituted or unsubstituted aminophenyl, 9-julodidyl, Y=CH— (wherein Y represents substituted or unsubstituted heterocyclic group containing nitrogen, or a group:

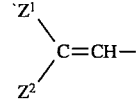

(wherein $Z^1$ and $Z^2$ are the same or different and represent substituted or unsubstituted phenyl), photochemical acid generator and binders.

11 Claims, No Drawings

CHEMICAL AMPLIFICATION RESIST COMPOSITION CONTAINING PHOTOCHEMICAL ACID GENERATOR, BINDER AND SQUARYLIUM COMPOUND

This application is a continuation, of application Ser. No. 08/052,999, filed Apr. 27, 1993, now abandoned.

FIELD OF THE INVENTION

The present invention relates to a highly-sensitive chemical amplification resist composition and, in particular, to a chemical amplification resist composition which is highly sensitive to light from visible to near infrared. The compositions of the present invention include both positive and negative-type chemical amplification resist compositions.

BACKGROUND OF THE INVENTION

A chemical amplification resist composition which can form a pattern by producing a secondary chemical reaction by the catalytic action of an acid formed by exposure to light using a photochemical acid generator as a sensitizing agent, thereby changing its solubility in developer is known in, J. Synthetic Org. Chem., Japan, 49, 437 (1991), SEN-I GAKKAISHI, 47, 358 (1991).

Squarylium compounds are also known to be used in the presence of an ethylenic unsaturated compound for the resist material (JP-A-63-142346, JP-A-2-306247). Squarylium compounds are also used as image formation system in the presence of light-unstable blocked surfactant (JP-A-60-243653), a charge generation material in electrophotography (Dyes and Pigments, 9, 85 (1988), JP-A-52-55643, JP-A-60-224674), the medium material for optical memory disc (JP-A-3-149263), the resin plate material for beam-condensing (JP-A-63-235370), LB (Langmuir-Brodget) membrane material (Nikkei New Material, published Oct., 26, 1987) and the like.

OBJECTS OF THE INVENTION

The main object of the invention is to provide a chemical amplification resist composition which is highly sensitive, in particular, to light from visible to near infrared and from which positive and negative type resists can be obtained.

This object as well as other objects and advantages of the present invention will become apparent to those skilled in the art from the following description.

SUMMARY OF THE INVENTION

According to the present invention, there is provided a chemical amplification resist composition which comprises squarylium compounds represented by the formula (I):

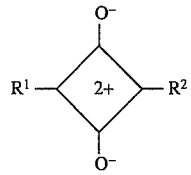

wherein $R^1$ and $R^2$ are the same or different and represent substituted or unsubstituted aminophenyl, 9-julolidyl, Y=CH— (wherein Y is substituted or unsubstituted heterocyclic group containing nitrogen, or a group represented by the formula:

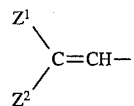

(wherein $Z^1$ and $Z^2$ are the same or different and represent substituted or unsubstituted phenyl), photochemical acid generators and binders.

DETAILED DESCRIPTION OF THE INVENTION

As the heterocyclic group containing nitrogen in the formula (I), there are indolin-2-ylidene, benz[e]indolin-2-ylidene, 2-benzothiazolinylidene, naphtho[2,1-d]thiazol-2(3H)-ylidene, naphtho[1,2-d]thiazol-2(1H)-ylidene, 1,4-dihydroquinolin-4-ylidene, 1, 2-hydroquinolin-2-ylidene, 2, 3-dihydro-1H-imidazo[4,5-b]quinoxalin-2-ylidene, 2-benzoselenazolinylidene and the like.

Aminophenyl, phenyl, 9-julolidyl and heterocyclic group containing nitrogen are optionally substituted with one to three substituents which may be the same or different. As the substituent, there are alkyl, alkoxy, aryl, aralkyl, halogen, nitro, hydroxy, amino and the like. Preferably the alkyl has 1 to 6 carbon atoms (for example, methyl, ethyl, propyl, isopropyl, butyl, amyl, hexyl and the like); the alkoxy has 1 to 6 carbon atoms (for example, methoxy, ethoxy, propoxy, butoxy, pentyloxy, hexyloxy and the like); the aryl has 6 to 10 carbon atoms (for example, phenyl, naphthyl and the like); the aralkyl has 7 to 10 carbon atoms (for example, benzyl, phenylethyl, phenylpropyl and the like) and the halogen may be fluorine, chlorine, bromine and iodine.

The squarylium compound (I) includes the known compounds (see, for example, JP-A-63-142346 and JP-A-2-306247) and other novel compounds. Those compounds are prepared, for example, by the following method.

Preparation 1

$R^1H$(or $R^1H_2^+ \cdot X^-$)+$R^2H$ (or $R^2H_2^+ \cdot X^-$)+squarlic acid→ compound (I)

wherein $R^1$ and $R^2$ are as defined above, X represents chlorine, bromine, iodine or a group:

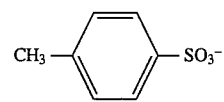

This reaction is carried out by reacting $R^1H$ (or $R^1H_2^+ \cdot X^-$), the equivalent moles of $R^2H$ (or $R^2H_2^+ \cdot X^-$) and the equivalent moles of squarlic acid and, if necessary, from equivalent to 2 times moles of a basic compound at 90° to 110° C. for 1 to 24 hours in a solvent. As the solvent, an alcoholic solvent is used alone or in admixture with benzene or toluene (alcohol is not less than 50%). Alternatively, acetic acid may be used as a solvent.

As the basic compound, there are triethylamine, quinoline, pyridine and the like.

The solvent is distilled from the reaction mixture or the product is filtered to give a compound (I).

Preparation 2

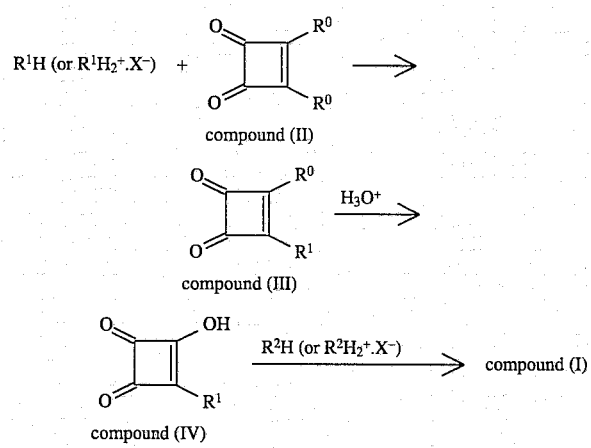

wherein $R^1$, $R^2$ and X are as defined above, $R^0$ represents chlorine or $OR^3$ (wherein $R^3$ represents alkyl having 1 to 4 carbon atoms).

As the alkyl having 1 to 4 carbon atoms, there are methyl, ethyl, propyl, butyl and the like.

A compound (III) is prepared by reacting $R^1H$ (or $R^1H_2^+ \cdot X^-$) and the equivalent moles of a compound (II) and, if necessary, the equivalent moles of a basic compound or metallic sodium at 10° to 35° C. for 5 minutes to 5 hours in a solvent.

As the basic compound, those described above can be used. As the solvent, there are chloroform, dichloromethane, 1,2-dichloroethane, diethyl ether, diisopropyl ether, tetrahydrofuran, toluene, benzene, dimethylformamide, dimethyl sulfoxide, methanol, ethanol, propanol, butanol and the like.

Compound (III) is isolated by distilling the solvent or filtering the product.

Compound (IV) is prepared by reacting compound (III) at 90° to 110° C. for 1 to 24 hours in a 50 to 90 (wt. %) aqueous solution of acetic acid. Compound (IV) is isolated as described above.

Compound (I) is prepared by reacting compound (IV) and the equivalent moles of $R^2H$ (or $R^2H_2^+ \cdot X^-$) and, if necessary, the equivalent moles of a basic compound at 90° to 110° C. for 1 to 24 hours in a solvent. As the basic compound, the above compounds can be used. As the solvent, an alcoholic solvent is used alone or in admixture with benzene or toluene (alcoholic solvent is not less than 50%).

Compound (I) is isolated as described above and can be further purified by recrystallization, forced precipitation, column chromatography and the like.

Representative compounds (I) are shown in Table 1 below.

TABLE 1

| Compound | $R^1$ | $R^2$ |
|---|---|---|
| 1 | (1,3,3-trimethyl-2-methylidene-indoline, =CH−) | (1,3,3-trimethyl-2-methylidene-indoline, −CH=) |
| 2 | (1,3,3-trimethyl-2-methylidene-benz[e]indoline, =CH−) | (1,3,3-trimethyl-2-methylidene-benz[e]indoline, −CH=) |

TABLE 1-continued

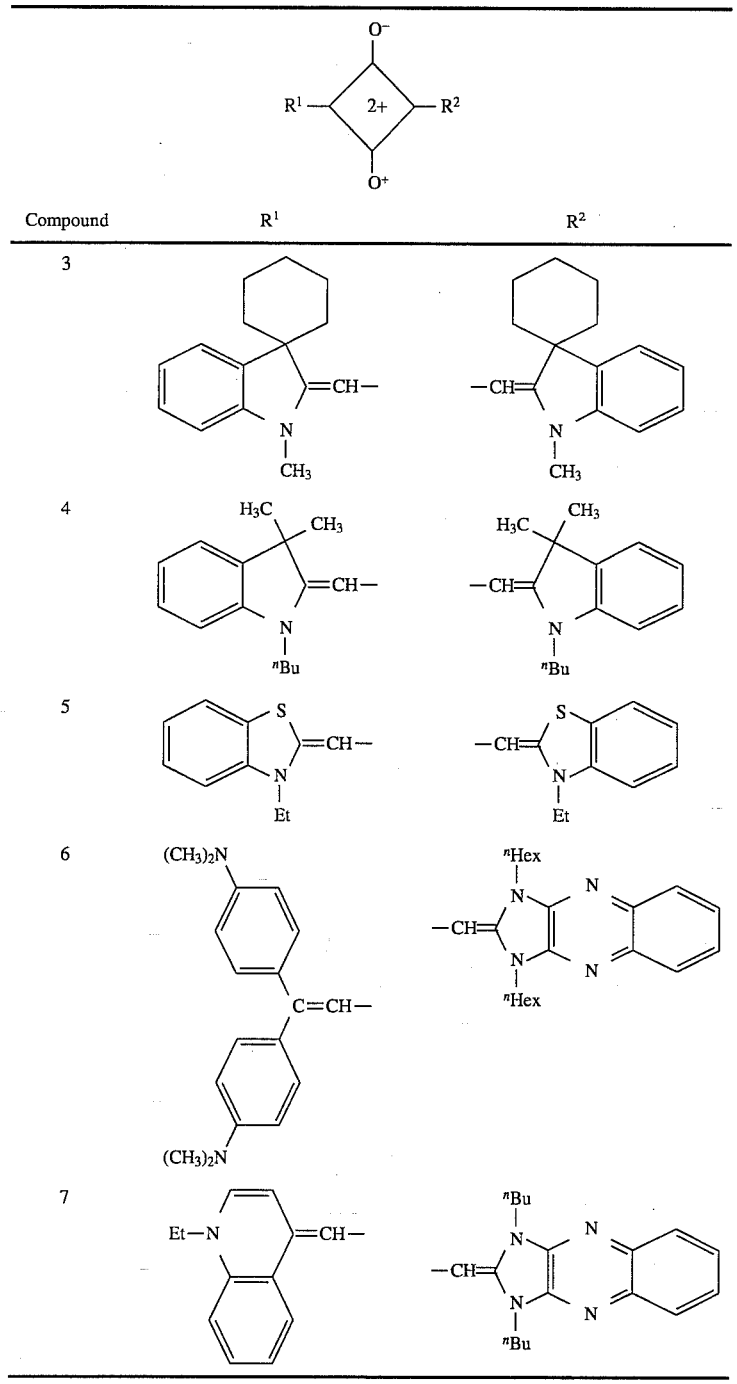

Note)
$^n$Bu: n-$C_4H_9$
Et: $C_2H_5$
$^n$Hex: n-$C_6H_{13}$

As the photochemical acid generator, there are: s-triazine compounds substituted with at least one trihalomethyl groups such as 2,4,6-tris(trichloromethyl)-s-triazine, 2-(4-methoxyphenyl)- 4,6-bis(trichloromethyl)-s-triazine, 2-(4-methoxy- 1-naphthalenyl)-4,6-bis(trichloromethyl)-s-triazine and the like, iron-arene complexes, such as a salt of ($\eta^6$-isopropylbenzene) ($\eta^5$-cyclopentadienyl)iron (II) and PF$_6^{\ominus}$ the like], onium salt {such as diaryliodonium salts [8-anilinenaphthalen-1-sulfonic acid diphenyliodonium salts and the like, triarylsulfonium salts triarylselenonium salts, dialkylphenacylsulfonium salts, dialkyl-4-hydroxyphenylsulfonium salts, iodonium salts and the like}, aryldiazonium salts, diazoketones, o-nitrobenzyl esters, such as 9,10-diethoxyanthracen-2-sulfonic acid-p-nitrobenzyl esters and the like], sulfonic acid esters, such as α-hydroxymethylbenzoinsulfonic acid ester, N-hydroxyimidosulfonate and the like and silanol-aluminium complexes and the like. Among them, s-triazine compounds substituted with at least one trihalomethyl groups are preferable and can be obtained, for example, according to the method described in JP-A-2-306247.

As the binder, there are acrylic acid or ester thereof, methacrylic acid or ester thereof, (anhydrous) maleic acid or ester thereof, acrylonitrile, styrene, α-alkylstyrene, α-acetoxystyrene, hydroxystyrene, α-alkylhydroxystyrene, α-acetoxyhydroxystyrene, or the substituted compounds obtained by protecting the hydroxy groups of the above compounds with a protecting group easily hydrolyzable by acid treatment (for example, trialkylsilyl group, tetrahydropyranyl group, t-butoxycarbonyl group and the like), or cyclic analogues thereof, vinyl acetate, vinyl chloride, vinylidene chloride, butadiene, crotonic acid, itaconic acid, N-substituted maleimide, vinyl benzoate, or copolymer of the above esters, polyethylene oxide, polyvinyl pyrrolidone, polyamide, polyurethane, polyethylene terephtalate, acetyl cellulose, methyl cellulose, ethyl cellulose, polyvinyl butyral, chlorinated polyolefine, polyalkylene, polyaldehyde, polycarbonate, epoxy resin, cresol novolak resin, melamine resin, alkyd resin, modified polyvinyl alcohol, or block or graft copolymer or modified polymer by combination of them and the like.

For improving the plasma-resistance upon development, an substituent containing silicone may be introduced in the binder before or after exposure to light.

The proportion of the compound (I) is 1 to 60 parts by weight (referred to as "part" hereinafter) relative to 100 parts of photochemical acid generator, and the amount of the binder is 2 to 100 parts, preferably 5 to 50 parts, relative to one part of the photochemical acid generator.

In particular, when the negative type resist is prepared by the thermal cross-linking reaction in the presence of an acid, a cross linking agent may be contained therein.

As the cross linking agent, there are amino compounds having as a functional group at least two alkoxymethyl group, methylol group, acetoxymethyl group and the like such as melamine derivative including: hexamethoxymethylated melamine (manufactured by MITSUI-CYANAMID, LTD., CYMEL® 300 series (1) and the like) benzoquanamine derivative (methyl/ethyl mixed alkylated benzoguanamine resin manufactured by MITSUI-CYANAMID, LTD., CYMEL® 1100 series (2) and the like), glycoluril derivative (tetramethylolglycoluril manufactured by MITSUI-CYANAMID, LTD., CYMEL® 1100 series (3) and the like, aromatic compounds that are at least disubstituted having, as a functional group, alkoxymethyl group, methylol group, acetoxymethyl group and the like such as 1,3,5-trihydroxymethylbenzene, 1,3,5-triacetoxymethylbenzene, 1,2,4,5-tetraacetoxymethylbenzene and the like. These cross linking agents can be synthesized according to the method described in Polym. Mater. Sci. Eng., 64, 241 (1991).

The amount of the cross linking agent is 0.1 to 100 parts, prefsrably 0.2 to 50 parts, relative to one part of the photochemical acid generator.

Further, solvent (such as ethyl cellosolve and the like), dissolution inhibiting agent (such as silyl ether and the like), plasticizer (such as dioctyl phthalate and the like), sensitivity improving agent (such as tertiary amine and the like), dark reaction inhibitor, colorant composed of organic or inorganic dye or pigment and the like may be contained therein depending upon the use of the chemically amplifying resist.

The chemical amplification resist composition of the present invention is prepared, for example, by mixing the compound (I), the photochemical acid generator and the binder and, if necessary, cross linking agent and the like. Further, a photosensitive material having the high sensitivity to, in particular, from visible to near infrared rays can be obtained by coating a solution of the chemical amplification resist composition of the present invention dissolved in a solvent (such as ethyl cellosolve and the like) on the aluminium plate having the treated surface, silicon wafer, glass plate and the like and drying.

As the light source for from visible to near infrared rays, the source for the rays which can be absorbed by the compound (I) such as mercury lamp, carbon arc lamp, xenon lamp, metal halide lamp, fluorescent lamp, tungsten lamp, halogen lamp, light-emitting diode, laser rays and the like can be used.

The temperature at heat-treating following the light irradiation is not higher than the melting point (decomposition point) of a photosensitive material obtained at room temperature, most preferably 50° to 120° C. Upon development for final image formation, the wet development using a solvent (for example, dilute aqueous alkaline solution and the like) and dry etching using heating, plasma, accelerated ion and the like can be used depending upon the composition of the photosensitive material.

The following Examples and Reference Examples further illustrate the present invention in detail but are not to be construed to limit the scope thereof.

EXAMPLE 1

100 Parts of poly-p-hydroxystyrene (Resin M, manufactured by Maruzen Petrochemical Co. Ltd.), 40 parts of hexamethoxymethylated melamine (CYMEL® 301, manufactured by MITSUI-CYANAMID, LTD.) 8 parts of 2,4,6-tris(chloromethyl)-s-triazine and 1 part of the compound 1 were dissolved in 900 ml of ethyl cellosolve to give a solution of a chemical amplification resist composition. This solution was coated on the aluminium plate which had been treated by graining and anodic oxidation using a spin-coater and dried using a warm air drier to give the dry-state thickness of 1 μm. A step tablet having the optical density step of 0.15 was piled on the resulting photosensitive sample, and the rays ($I_0$=80.5 μJ/cm$^2$.s) having the wavelength around 630 nm were irradiiated from 3 KW ultra-high pressure mercury lamp through a heat rays absorbing filter HA-30 (manufactured by HOYA Corporation), a colored glass filter R-61 and an interference filter (both manufactured by Toshiba Glass Co., Ltd.) Subsequently, the heat-treating was carried out in an oven at 100° C. for 5 minutes, the development was carried out using an aqueous solution containing 2 wt % sodium metasilicate, the ink was applied using the ink Pl-2 for PS form plate development (manufactured by Fujiphoto Film Co., Ltd,) and the necessary energy for curing was calculated from the curing step number with the ink applied to give the high sensitivity of 0.7 mJ/cm$^2$.

EXAMPLE 2

The sensitivity of 1.4 mJ/cm$^2$ was obtained according to the same manner as that in Example 1 except that one part of the compound 4 and heat treating conditions (90° °C., 10 minutes) were used in place of one part of the compound 1 and the heat treating conditions (100° C., 5 minutes).

EXAMPLE 3

The very high sensitivity of 0.24 mJ/cm$^2$ was obtained according to the same manner as that in Example 1 except that the heat treating conditions (90° C., 10 minutes) were used in place of (100° C., 5 minutes).

EXAMPLE 4

The sensitivity of 3.4 mJ/cm$^2$ was obtained according to the same manner as that in Example 1 except that 8 parts of $PF_6^\ominus$ salt of ($\eta^6$-isopropylbenzene) ($\eta^5$-cyclopentadienyl) iron (II) was used in place of 8 parts of 2,4,6-tris(trichloromethyl)-s-triazine.

EXAMPLE 5

The sensitivity of 4 mJ/cm$^2$ was obtained according to the same manner as that in Example 1 except that one part of the compound 3 and the heat treating conditions (90° C., 10 minutes) were used in place of one part of the compound 1 and heat treating conditions (100° C., 5 minutes).

EXAMPLE 6

The sensitivity of 4.5 mJ/cm$^2$ was obtained according to the same manner as that in Example 1 except that one part of the compound 2 and heat treating conditions (90° C., 10 minutes) were used in place of one part of the compound 1 and heat treating condiitions (100° C., 5 minutes).

EXAMPLE 7

The sensitivity of 5 mJ/cm$^2$ was obtained according to the same manner as that in Example 1 except that 100 parts of poly-p-hydroxystyrene (PHS MARUKA LYNCUR H3F, manufactured by Maruzen Petrochemical Co., Ltd.), one part of the compound 6 obtained in Reference Example 1 and the heat treating conditions (90° C., 10 minutes) were used in place of 100 parts of poly-p-hydroxystyrene (Resin M, manufactured by Maruzen Petrochemical Co., Ltd.), one part of the compound 1 and the heat treating conditions (100° C., 5 minutes), and the rays ($I_0$=2.46 mJ/cm$^2$.s) having the wavelength around 600 to 800 nm were irradiated without using an interference filter KL-63 (manufactured by Toshiba Glass Co., Ltd.)

EXAMPLE 8

The sensitivity of 5 mJ/cm$^2$ was obtained according to the same manner as that in Example 7 except that one part of the compound 7 obtained in Reference Example 2 was used in place of one part of the compound 6 obtained in Reference Example 1.

EXAMPLE 9

The sensitivity of 18 mJ/cm$^2$ was obtained according to the same manner as that in Example 7 except that one part of the compound 5 was used in place of one part of the compound 6 obtained in Reference Example 1.

EXAMPLE 10

The sensitivity of 0.9 mJ/cm$^2$ was obtained according to the same manner as that in Example 1 except that 100 parts of polymethacrylic acid ester polymer and the heat treating conditions (90° C., 6 minutes) were used in place of 100 parts of poly-p-hydroxystyrene (Resin M, manufactured by Maruzen Petrochemical Co., Ltd.), and the heat treating conditions (100° C., 5 minutes).

EXAMPLE 11

A photosensitive sample having the dry-state thickness of 1 μm was obtained by spin-coating on the glass having the treated surface a solution of a chemical amplification resist composition prepared according to the same manner as that in Example 1 except that 100 parts of poly-p-hydroxystyrene [manufactured by Maruzen Petrochemical Co., Ltd., PHS MARUKA LYNCUR H3F] and 40 parts of hexamethoxymethylated melamine (CYMEL® 300, manufactured by MITSUI-CYANAMID, LTD.), were used in place of 100 parts of poly-p-hydroxystyrene (Resin, manufactured by Maruzen Petrochemical Co., Ltd.), and 40 parts of hexamethoxymethylated melamine (CYMEL® 301, manufactured by MITSUI-CYANAMID, Ltd.) and drying. The He-Ne laser rays were split into two light flux using a beam splitter and the two light flux were introduced in the photosensitive sample from the same plane at the angle θ=74°. After exposure to light, the photosensitive sample was heat-treated in an oven at 90° C. for 15 minutes, subsequently developed with an aqueous solution containing 2 wt % sodium metasilicate, washed with water and dried to give the bright surface hologram.

EXAMPLE 12

The sensitivity of 0.7 mJ/cm$^2$ was obtained according to the same manner as that in Example 1 except that 100 parts of metacresol novolak resin (m/p=6/4) and the heat treating conditions (90° C., 10 minutes) were used in place of 100 parts of poly-p-hydroxystyrene (Resin M, manufactured by Maruzen Petrochemical Co., Ltd.), and the heat treating conditions (100° C., 5 minutes).

EXAMPLE 13

The sensitivity of 6 mJ/cm$^2$ was obtained according to the same manner as that in Example 1 except that 100 parts of styrene-maleic acid monoisobutyl copolymer and the heat treating conditions (90° C., 1 minute) were used in place of 100 parts of poly-p-hydroxystyrene (Resin M, manufactured by Maruzen Petrochemical Co., Ltd.), and the heat treating conditions (100° C., 5 minutes).

EXAMPLE 14

The sensitivity of 43 mJ/cm$^2$ was obtained according to the same manner as that in Example 7 except that 42 parts of hexamethoxymethylated melamine (CYMEL® 300, manufactured by MITSUI-CYANAMID, LTD.), 9 parts of 8-anilinenaphthalen-1-sulfonic, acid diphenyliodonium salt, one part of the compound 1 and the heat treating conditions (90° C., 6 minutes) were used in place of 40 parts of hexamethoxymethylated melamine (CYMEL® 301, manufactured by MITSUI-CYANAMID, LTD.), 8 parts of 2,4,6-tris(trichloromethyl)-s-triazine, one part of the compound 6 obtained in Reference Example 1 and the heat treating conditions (90° C., 10 minutes).

EXAMPLE 15

The sensitivity of 3 mJ/cm$^2$ was obtained according to the same manner as that in Example 1 except that 8 parts of 2-(4-methoxyphenyl)-4,6-bis(trichloromethyl)-s-triazine and the heat treating conditions (90° C., 12 minutes) were used in place of 8 parts of 2,4,6-tris(trichloromethyl)-s- triazine and the heat treating conditions (100° C., 5 minutes).

EXAMPLE 16

100 Parts of alkali-insoluble polyimide containing fluorine in which the hydroxy group is protected with tetrahydropyranyl group, 8.4 parts of 2,4,6-tris(trichloromethyl)-s-triazine and 0.9 parts of the compound 1 were dissolved in 900 ml of ethyl cellosolve to give a solution of chemical amplification resist composition. This solution was coated on the aluminium plate treated with graining and anodic oxidation using a spin-coater, and dried using a warm air drier to give the dry-state thickness of 1 μm. A step tablet having the optical density step of 0.15 was piled on the resulting photosensitive sample, and the rays having the wavelength around 610 nm were irradiated from 3 KW ultra-high pressure mercury lamp through a heat rays absorbing filter HA-30 (manufactured by HOYA Corporation) and a colored glass filter R-61 (manufactured by Toshiba Glass Co., Ltd.). The photosensitive sample was subsequently heat-treated in an oven at 120° C. for 15 minutes, and developed with DN3C developer for PS form plate (manufactured by Fujiphoto Film Co., Ltd.), upon which the irradiated parts were dissolved to give a positive image.

EXAMPLE 17

The sensitivity of 2.0 mJ/cm$^2$ was obtained according to the same manner as that in Example 1 except that 100 parts of poly-p-hydroxystyrene PHS MARUKA LYNCUR H3F, manufactured by Maruzen Petrochemical Co., Ltd.), 40.8 parts of hexamethoxymethylated melamine (manufactured by K&K,) 7.6 parts of 2,4,6-tris(trichloromethyl)-s-triazine, 1.02 parts of the compound 6 obtained in Reference Example 1, the rays ($I_0=162$ μJ/cm$^2$.s) having the wavelength around 780 nm obtained by irradiating from 3 KW ultra-high pressure mercury lamp and passing through KL-78 (manufactured by Toshiba Glass Co., Ltd.) and the heat treating conditions (90° C., 10 minutes) were used in place of 100 parts of poly-p-hydroxystyrene (Resin M, manufactured by Maruzen Petrochemical Co., Ltd.), 40 parts of hexamethoxymethylated melamine (CYMEL® 301 manufactured by MITSUI-CYANAMID, Ltd.), 8 parts of 2,4,6-tris(trichloromethyl)-s-triazine, one part of the compound 1, the rays ($I_0=80.5$ μJ/cm$^2$.s) having the wavelength around 630 nm obtained by irradiating from 3 KW ultra-high pressure mercury lamp and passing through a heat rays absorbing filter HA-30 (manufactured by HOYA Corporation), a colored glass filter R-61 and an interference filter KL-63 (both manufactured by Toshiba Glass Co., Ltd.)

EXAMPLE 18

The sensitivity of 1.36 mJ/cm$^2$ was obtained according to the same manner as that in Example 17 except that 1.25 parts of the compound 7 obtained in Reference Example 2 and the heat treating conditions (90° C., 11 minutes) were used in place of 1.02 parts of the compound 6 obtained in Reference Example 1 and the heat treating conditions (90° C., 10 minutes).

EXAMPLE 19

The sensitivity of 3.1 mJ/cm$^2$ was obtained according to the same manner as that in Example 17 except that 1.1 parts of the compound 8 obtained in Reference Example 3 and the heat treating conditiions (90° C., 13 minutes) were used in place of 1.02 parts of the compound 6 obtained in Reference Example 1 and the heat treating conditions (90° C., 10 minutes).

EXAMPLE 20

The sensitivity of 3.4 mJ/cm$^2$ was obtained according to the same manner as that in Example 1 except that 100 parts of poly-p-hydroxystyrene (manufactured by Maruzen Petrochemical Co., Ltd., PHS MARUKA LYNCUR H3F), 48 parts of hexamethoxymethylated melamine (manufactured by K & K), 1.1 parts of the compound 9 obtained in Reference Example 4 and the heat treating conditions (90° C., 8 minutes) were used in place of 100 parts of poly-p-hydroxystyrene (manufactured by Maruzen Petrochemical Co., Ltd., Resin M), 40 parts of hexamethoxymethylated melamine (manufactured by MITSUI-CYANAMID, LTD., CYMEL® 301), one part of the compound 1 and the heat treating conditions (100° C., 5 minutes).

EXAMPLE 21

The sensitivity of 1.9 mJ/cm$^2$ was obtained according to the same manner as that in Example 20 except that 1.1 parts of the compound 10 having the following structure was used in place of 1.1 parts of the compound 9 obtained in Reference Example 4.

The compound 10 is known (see, for example, JP-A-2-306247).

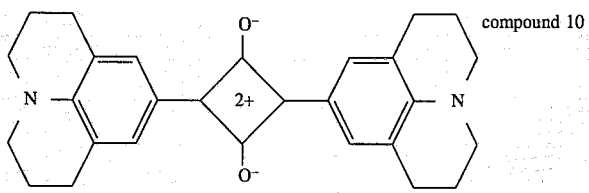

EXAMPLE 22

The sensitivity of 4.9 mJ/cm$^2$ was obtained according to the same manner as that in Example 20 except that 40 parts of hexamethoxymethylated melamine (manufactured by K & K), 1.0 part of the compound 11, the rays ($I_0=2.55$ mJ/cm$^2$.s) having the wavelength of not less than 660 nm obtained by irradiating from 3 KW ultra-high pressure mercury lamp and passing through a heat rays absorbing filter HA-30 (manufactured by HOYA Corporation) and a colored glass filter R-66 (manufactured by Toshiba Glass Co., Ltd.) and the heat treating conditions (90° C., 18 minutes) were used in place of 48 parts of hexamethoxymethylated melamine (manufactured by K & K), 1.1 parts of the compound 9, the rays ($I_0=80.5$ μJ/cm$^2$.s) having the wavelength around 630 nm obtained by irradiating from 3 KW ultra-high pressure mercury lamp and passing through a heat rays absorbing filter HA-30 (manufactured by HOYA Corporation), a colored glass filter R-61 and an interference filter KL-63 (both filters are manufactured by Toshiba Glass Co., Ltd.) and the heat treating conditions (90° C., 8 minutes).

EXAMPLE 23

The sensitivity of 3.3 mJ/cm$^2$ was obtained according to the same manner as that in Example 20 except that 40 parts of hexamethoxymethylated melamine (manufactured by K & K), 1.0 part of the compound 12, the rays ($I_0=112$ μm/cm$^2$.s) having the wavelength around 680 nm obtained by irradiating from 3 KW ultra-high pressure mercury lamp and passing through a heat rays absorbing filter HA-30 (manufactured by HOYA Corporation), a colored glass filter R-66 and an interference filter KL-68 (both manufactured by Toshiba Glass Co., Ltd.) and the heat treating conditions (90° C., 5 minutes) were used in place of 48 parts of hexamethoxymethylated melamine (manufactured by K & K), 1.1 parts of the compound 9, the rays ($I_0=80.5$ μJ/cm$^2$.s) having the wavelength around 630 nm obtained by irradiating from 3 KW ultra-high pressure mercury lamp and passing through a heat rays absorbing filter HA-30 (manufactured by HOYA Corporation), a colored glass filter R-61 and an interference filter KL-63 (both manufactured by Toshiba Glass Co., Ltd.) and the heat treating conditions (90° C., 8 minutes).

The compound 12 having the following structure is known (see, for example, JP-A-3-149263).

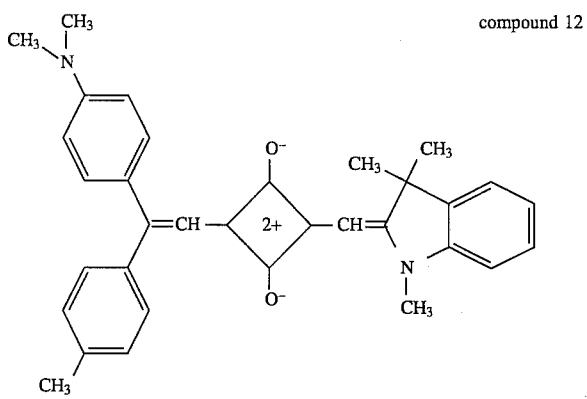

compound 12

Reference Example 1

15 ml of dichloromethane was added to 0.3 g of 3,4-dichloro-3-cyclobuten-1,2-dione produced according to Tetrahedron Lett. No. 10 (1970) 781), and 0.54 g of 1,1-bis(p-dimethylaminophenyl)ethylene was added thereto to stir at room temperature. After 1 hour, the dichloromethane was distilled off from the reaction mixture using a rotary evaporator. 7.6 ml of acetic acid and 10 ml of water were added to the residue and the mixture was heated on an oil bath at 100° C. After heating for 1 hour, the acetic acid and water were distilled off using a rotary evaporator. 20 ml of n-butanol and 20 ml of benzene as well as 1.05 g of 1,3-di-n-hexyl- 2-methylimidazo[4,5-b]quinoxalinium tosylate and 0.27 g of quinoline were added to the residue and the mixture was heated for 2 hours. Thereafter, the mixture was concentrated using a rotary evaporator, and purified by column chromatography to give 0.45 g of a compound 6.

The melting point and the results of elementary analysis are as follows.
Melting point: 147° C. (dec.)
Elementary analysis
 Calc'd (%): C 75.83, H 7.52, N 12.06
 Found (%): C 76.13, H 7.54, N 12.26

Reference Example 2

A mixture of 1.98 g of 3,4-diisopropoxy-3-cyclobuten-1,2-dione, 2.99 g of N-ethyllepidinium iodide and 20 ml of isopropanol was stirred at room temperature, 0.23 g of sodium was added thereto and the mixture was stirred for 4 hours. The insolubles were filtered, the flitrate was concentrated, and the residue was purified by column chromatography. 30 ml of acetic acid and 10 ml of water were added to this purified material, and the mixture was heated at 95° C. for 1.5 hours. After completion of the reaction, the volathe, portion was concentrated and dried. 13 ml of n-butanol and 0.92 g of 1,3-di-n-butyl-2-methylimidazo[4, 5-b]quinoxalinium chloride and 0.27 g of quinoline were added to the dried material, and the mixture was heated to reflux for 4 hours. The solvent and produced water were distilled off using a rotary evaporator. The residue was purified by column chromatography to give 0.31 g of a compound 7.

The melting point and the results of elementary analysis are as follows.
Melting point: 237°–238° C. (dec.)
Elementary analysis:
 Calc'd (%): C 74.84, H 6.47, N 12.83
 Found (%): C 75.13, H 6.52, N 12.94

Reference Example 3

A mixture of 1.98 g of 3,4-diisopropoxy-3-cyclobuten-1,2-dione, 2.99 g of N-ethyllepidinium iodide and 20 ml of isopropanol was stirred at room temperature, 0.23 g of sodium was added thereto, and the mixture was stirred for 4 hours. The insolubles were filtered, the filtrate was concentrated, and the residue was purified by column chromatography.

30 ml of acetic acid and 10 ml of water were added to this purified material, and the mixture was heated at 90°–100° C. for 1.5 hours. After completion of the reaction, the volatile portion was concentrated and dried. 0.37 g of 1,3,3-trimethyl-2-methyleneindoline, 21 ml of n-butanol and 21 ml of benzene were added to the dried material, and the mixture was heated to reflux for 5 hours. The volatile portion was concentrated, and the residue was purified by column chromatography to give 0.24 g of a compound 8 having the following structure.

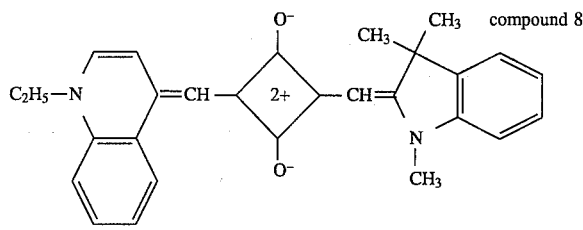

compound 8

The melting point and the results of elementary analysis are as follows.
Melting point: 260°–263° C. (dec.)
Elementary analysis:
 Calc'd (%): C 79.59, H 6.20, N 6.63
 Found (%): C 79.90, H 6.15, N 6.80

Reference Example 4

20 ml of dichloromethane was added to 1.5 g of 3,4-dichloro-3-cyclobuten-1,2-dione, 1.7 g of 1,3,3-trimethyl-2-methyleneindoline was added dropwise under ice-cooling, and after 2 hours, the precipitates were filtered and dried. 35 ml of acetic acid and 50 ml of water were added to the dried material, the mixture was heated on an oil bath at 100° C. for 1 hour, and the acetic acid and water were distilled off using a rotary evaporator. 100 ml of n-butanol, 5.25 g of 1,3-di-n-hexyl-2-methylimidazo[4,5-b]quinoxalinium tosylate and 1.01 g of triethylamine were subsequently added to the residue, and the mixture was heated to reflux for 3 hours. The volatile portion was concentrated, and the residue was purified by column chromatography to give 3.57 g of a compound 9 having the following structure.

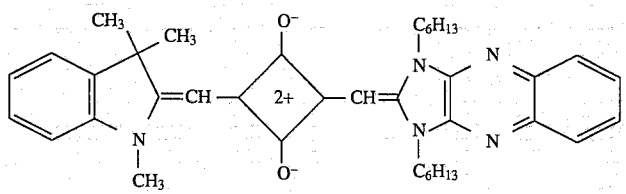

The melting point and the results of elementary analysis are as follows.
Melting point: 173.5°–174.9° C.
Elementary analysis:
  Calc'd (%): C 75 59, H 7.51, N 11.60
  Found (%): C 73.99, H 7.47, N 11.17

Reference Example 5

0.17 g of a compound 11 having the following structure was prepared according to the same manner as that in Reference Example 3 except that 0.72 g of 1,1,2,3-tetramethyl- 1H-benz[e]indolium iodide and 0.28 g of quinoline were added in place of 1,3,3-trimethyl-2-methyleneindoline.

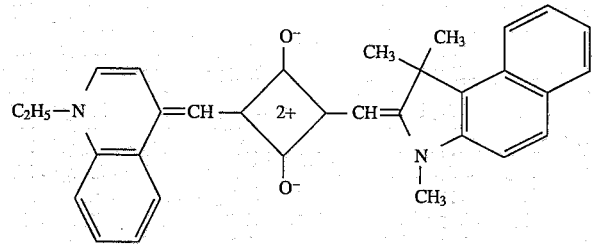

The melting point and the results of elementary analysis are as follows.
Melting point: 266°–267.6° C. (dec.)
Elementary analysis:
  Calc'd: C 81.33, H 5.97, N 5.93
  Found: C 81.52, H 6.06, N 5.97

What is claimed is:

1. A chemical amplification resist composition which consists essentially of (i) a photochemical acid generator; (ii) 1 to 60 parts by weight relative to 100 parts of the photochemical acid generator of squarylium compounds represented by the formula (1):

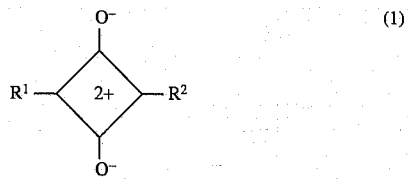

wherein $R^1$ and $R^2$ are the same or different and represent substituted or unsubstituted aminophenyl, 9-julolidyl, Y=CH—, (wherein Y represents a substituted or an unsubstituted heterocyclic group containing nitrogen), or a group

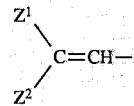

(wherein $Z^1$ and $Z^2$ are the same or different and represent a substituted or an unsubstituted phenyl), and; (iii) 2 to 100 parts by weight relative to 1 part of the photochemical acid generator of binders.

compound 9

2. The chemical amplification resist composition according to claim 1, wherein the aminophenyl group, phenyl group and 9-julolidyl group are optionally substituted with the same or differnt one to three substituents selected from the group consisting of an alkyl having 1 to 6 carbon atoms, alkoxy having 1 to 6 carbon atoms, aryl having 6 to 10 carbon atoms, aralkyl having 7 to 10 carbon atoms, halogen, nitro, hydroxy and amino, and the heterocyclic group containing nitrogen is selected from the group consisting of indolin-2-ylidene, benz[e]indolin-2-ylidene, 2-benzothiazolinylidene, naphtho[2,1-d]thiazol-2(3H)-ylidene, naphtho[1,2-d]thiazol-2(1H)-ylidene, 1,4-dihydroquinolin-4-ylidene, 1, compound 11

2-dihydroquinolin-2-ylidene, 2, 3-dihydro-1H-imidazo[4,5-b]quinoxalin-2-ylidene and 2-benzoselenazolinylidene, said heterocyclic group containing nitrogen being optionally substituted with the same or different one to three substituents selected from the group consisting of an alkyl having 1 to 6 carbon atoms, alkoxy having 1 to 6 carbon atoms, aryl having 6 to 10 carbon atoms, aralkyl having 7 to 10 carbon atoms, halogen, nitro, hydroxy and amino.

3. The chemical amplification resist composition according to claim 1, wherein the squarylium compound is selected from the group consisting of

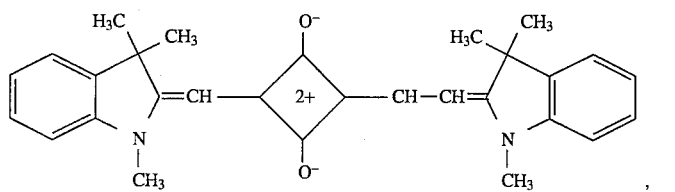
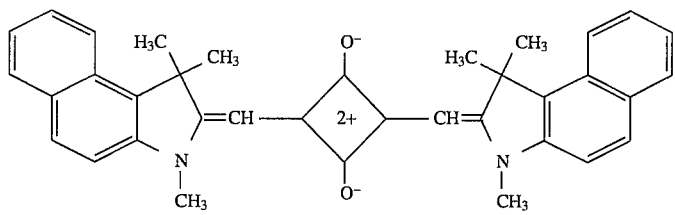
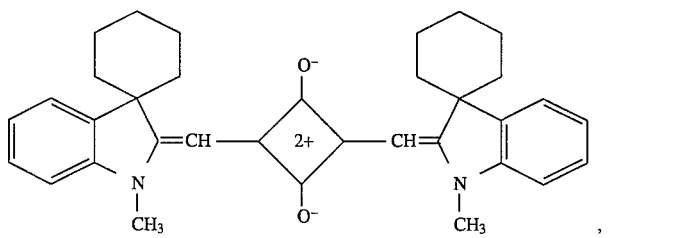
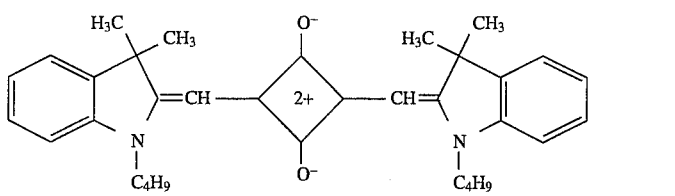
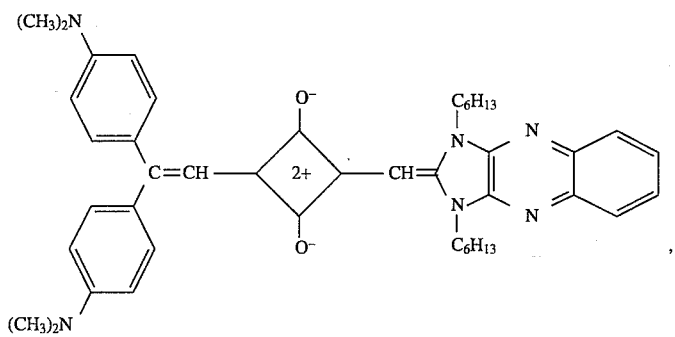
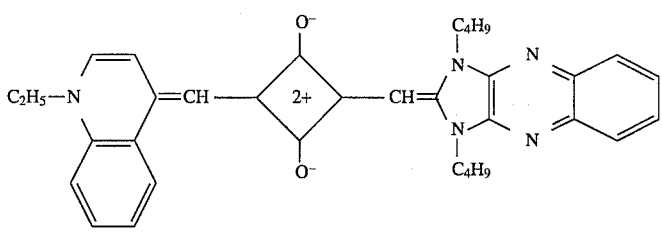
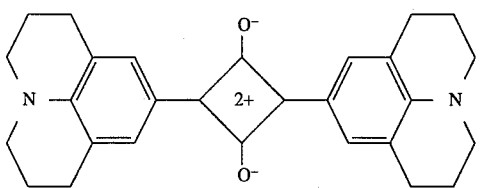
and

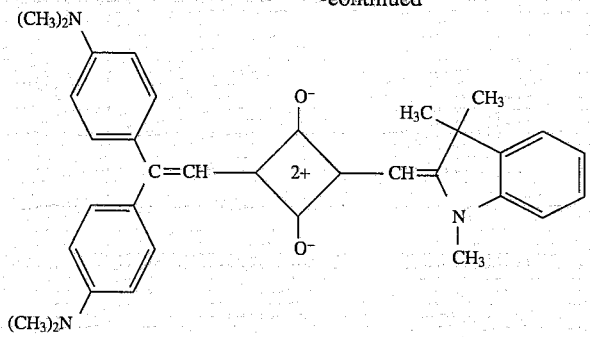

4. The chemical amplification resist composition according to claim 1, wherein the photochemical acid generator is selected from the group consisting of s-triazine compound substituted with at least one trihalomethyl groups, iron-arene complexes, onium salt, aryldiazonium salt, diazoketones, o-nitrobenzyl ester, sulfonic acid ester and silanol-aluminium complex.

5. The chemical amplification resist composition according to claim 4, wherein the photochemical acid generator is s-triazine compound substituted with at least one trihalomethyl groups.

6. The chemical amplification resist composition according to claim 5, wherein the s-triazine compound substituted with at least one trihalomethyl groups is selected from the group consisting of 2,4,6-tris(trichloromethyl)-s-triazine, 2-(4-methoxyphenyl)-4,6-bis(trichloromethyl)-s-triazine and 2-(4-methoxy-1-naphthalenyl)- 4,6-bis(trichloromethyl)-s-triazine.

7. The chemical amplification resist composition according to claim 4, wherein the iron-allene compound is a salt of $$PF_6^{\ominus}$$

of ($\eta^6$-isopropylbenzene) ($\eta^5$-cyclopentadienyl)iron (II).

8. The chemical amplification resist composition according to claim 4, wherein the onium salt is selected from the group consisting of diaryliodonium salt, triarylsulfonium salt, triarylselenonium salt, dialkylphenacylsulfonium salt, dialkyl- 4-hydroxyphenylsulfonium salt and iodonium salt.

9. The chemical amplification resist composition according to claim 4, wherein the o-nitrobenzyl ester is 9,10-diethoxyanthracen-2-sulfonic acid-p-nitrobenzyl ester.

10. The chemical amplification resist composition according to claim 4, wherein the sulfonic acid ester is selected from the group consisting of α-hydroxymethylbenzoinsulfonic acid ester and N-hydroxyimidosulfonate.

11. The chemical amplification resist composition according to claim 1, wherein the binder is selected from the group consisting of acrylic acid or ester thereof, methacrylic acid or ester thereof, (anhydrous) maleic acid or ester thereof, acrylonitrile, styrene, α-alkylstyrene, α-acetoxystyrene, hydroxystyrene, α-alkylhydroxystyrene, α-acetoxyhydroxystyrene, or the substituted compounds obtained by protecting the hydroxy groups of the above compounds with a protecting group easily hydrolyzable by acid treatment, or cyclic analogues thereof, vinyl acetate, vinyl chloride, vinylidene chloride, butadiene, crotonic acid, itaconic acid, N-substituted maleimide, vinyl benzoate, or copolymer of the above esters, polyethylene oxide, polyvinyl pyrrolidone, polyamide, polyurethane, polyethylene terephtalate, acetyl cellulose, methyl cellulose, ethyl cellulose, polyvinyl butyrate, chlorinated polyolefine, polyalkylene, polyaldehyde, polycarbonate, epoxy resin, cresol novolak resin, melamine resin, alkyd resin, modified polyvinyl alcohol, and block or graft copolymer or modified polymer by combination of them.

* * * * *

UNITED STATES PATENT AND TRADEMARK OFFICE
CERTIFICATE OF CORRECTION

PATENT NO. : 5,527,659

DATED : June 18, 1996

INVENTOR(S) : TSUGUO YAMAOKA, ET AL.    Page 1 of 3

It is certified that error appears in the above-identified patent and that said Letters Patent is hereby corrected as shown below:

On the title page:

AT [56] REFERENCES CITED

Attorney, Agent, or Firm

"Fitzpatrick Cella Harper & Scinto" should read
--Fitzpatrick, Cella, Harper & Scinto--.

COLUMN 1

Line 30, "system" should read --systems--; and
Line 36, "(Langmuir-Brodget)" should read
--(Langmuir-Blodgett)--.

COLUMN 4

Line 28, "compounds" should read --Compounds--.

COLUMN 5

Line 61, "groups" should read --groups,--.

COLUMN 6

Line 60, "like]," should read --like,--
and "salt" should read --salts--;
Line 61, "[8-" should read --8- --;
Line 62, "salts" (second occurrence) should
read --salts,--; and
Line 67, "like]," should read --like,--.

UNITED STATES PATENT AND TRADEMARK OFFICE
CERTIFICATE OF CORRECTION

PATENT NO. : 5,527,659

DATED : June 18, 1996

INVENTOR(S) : TSUGUO YAMAOKA, ET AL.

It is certified that error appears in the above-identified patent and that said Letters Patent is hereby corrected as shown below:

COLUMN 7

Line 27, "an" should read --a--;
    Line 48, "like," should read --like)--; and
    Line 56, "prefsrably" should read --preferably--.

COLUMN 8

Line 44, "rays" should read --ray--.

COLUMN 10

Line 14, "(Resin," should read --(Resin M,--.

COLUMN 11

Line 4, "Parts" should read --parts--;
    Line 30, "PHS" should read --(PHS--; and
    Line 42, "301" should read --301,--.

COLUMN 13

Line 36, "produced" should read --(produced--.

COLUMN 14

Line 2, "volathe," should read --volatile--.

UNITED STATES PATENT AND TRADEMARK OFFICE
CERTIFICATE OF CORRECTION

PATENT NO. : 5,527,659

DATED : June 18, 1996

INVENTOR(S) : TSUGUO YAMAOKA, ET AL.

It is certified that error appears in the above-identified patent and that said Letters Patent is hereby corrected as shown below:

COLUMN 15

Line 15, "C 75 59," should read --C 75.59,--.

COLUMN 19

Line 35, "iron-allene" should read --iron-arene--; and
Line 38, "$PF^{6\ominus}$" should read --$PF_6^{\ominus}$--.

Signed and Sealed this

Seventh Day of October, 1997

Attest:

BRUCE LEHMAN

Attesting Officer          Commissioner of Patents and Trademarks